(12) United States Patent
Nazarian

(10) Patent No.: US 7,061,789 B2
(45) Date of Patent: Jun. 13, 2006

(54) SENSING SCHEME FOR PROGRAMMABLE RESISTANCE MEMORY USING VOLTAGE COEFFICIENT CHARACTERISTICS

(75) Inventor: Hagop A. Nazarian, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 10/610,800

(22) Filed: Jul. 2, 2003

(65) Prior Publication Data
US 2005/0002218 A1 Jan. 6, 2005

(51) Int. Cl.
*G11C 11/00* (2006.01)

(52) U.S. Cl. ............ 365/148; 365/189.01; 365/189.07; 365/233; 365/236

(58) Field of Classification Search ................ 365/148, 365/189.01, 189.07, 233, 236
See application file for complete search history.

(56) References Cited

U.S. PATENT DOCUMENTS

| 6,188,615 | B1* | 2/2001 | Perner et al. .......... 365/189.01 |
| 6,317,375 | B1* | 11/2001 | Perner ........................ 365/206 |
| 6,504,750 | B1* | 1/2003 | Baker ......................... 365/148 |
| 6,577,525 | B1* | 6/2003 | Baker ......................... 365/148 |
| 6,781,906 | B1* | 8/2004 | Perner et al. ............... 365/209 |
| 6,891,768 | B1* | 5/2005 | Smith et al. ................ 365/207 |

* cited by examiner

*Primary Examiner*—Connie C. Yoha
(74) *Attorney, Agent, or Firm*—Dickstein Shapiro Morin & Oshinsky LLP

(57) ABSTRACT

A method and apparatus for sensing the resistance state of data in a resistance memory cell by using the voltage coefficient of the cell instead of only its resistance. A voltage potential is applied across the resistance memory cell allowing the voltage coefficient of the cell to be determined and subsequently used to determine the logic state of the cell.

24 Claims, 7 Drawing Sheets

SENSING SCHEME FOR PROGRAMMABLE RESISTANCE MEMORY USING VOLTAGE COEFFICIENT CHARACTERISTICS

FIELD OF THE INVENTION

The present invention relates generally to memory circuits and, more specifically to a circuit and method for sensing the logic state of data stored within a programmable resistance memory cell.

BACKGROUND OF THE INVENTION

Several types of semi-volatile or non-volatile programmable resistance memory cells have been developed. Magnetic random access memory ("MRAM") is one such type of programmable resistance memory device, which utilizes magnetic vector orientations to store data. MRAM devices do not have to be periodically refreshed and could be used for long-term data storage. In addition, read and write operations performed on MRAM devices are orders of magnitude faster than read and write operations performed on conventional long-term storage devices such as hard drives and non-volatile memory, such as Flash or electrically erasable programmable read-only memory devices. Furthermore, MRAM devices are potentially more compact because the memory cells are stackable. Thus, MRAM devices have a potential to be ideal memory devices because they are randomly accessible, offer very quick read and write times, are non-volatile, but highly alterable, and do not need to be refreshed as compare with conventional DRAM memory devices.

A typical MRAM device includes an array of memory cells. Word lines extend along rows of the array, and bit lines extend along columns of the array. Each memory cell is located at a cross point of a word line and a bit line. Each memory cell stores a bit of information as an orientation of magnetization vectors of a pinned and free ferromagnetic layer. The free and pinned magnetization vectors of each memory cell assume one of two stable orientations at any given time. These two stable orientations, often referred to as parallel and anti-parallel, represent logic "1" or "0" states respectively.

The magnetization vector orientation affects the resistance of the MRAM memory cell. As a result, the relative magnetization vector orientation of a selected memory cell and, therefore, the logic state of the memory cell may be read by sensing the resistance of the cell. For example, when the relative orientation of the vector magnetization is parallel, the cell's resistance is low and the value of the memory cell has a logic 1 state. However if the relative orientation of the magnetization vector is anti-parallel, the cell exists in a high resistance state representing a logic 0 state.

The logic state of a selected MRAM memory cell may be sensed by applying a voltage to the cell, measuring a sense current that flows through the cell and determining its resistance state through a direct reading. Ideally, the resistance would be proportional to the sense current. The logic state of the selected memory cell may also be sensed by applying a voltage to the cell. However, instead of measuring the sense current flowing through the cell, the current is converted to a voltage by integrating the sense current over a period of time. The voltage is then measured in order to determine the resistance of the memory cell.

Sensing the logic state of an MRAM memory cell using current or voltage sensing techniques is challenging due to the configuration of the MRAM cross matrix array structure, which imposes multiple design constraints on the device. In particular, the need for high storage density and low cost warrants the minimizing of the number of transistors in the memory array. As such, a cell in a cross point array does not include an access transistor. As a result, each resistive element remains operatively connected to respective row and column lines at all times. Consequently, as a memory cell is sensed, it is shunted by a significant leakage current path. In a conventional MRAM device, an element in a high resistance state may have a resistance of about 1 MΩ, while an element in a low resistance state may have a resistance of about 950KΩ. The differential resistance between a logic one and a logic zero is about 50KΩ or 5% of scale. Rapidly distinguishing a 5% resistance differential on a scale of 1 MΩ in the face of low resistance leakage paths through neighboring cells and with a minimum of circuitry is a challenge.

In the current and voltage sensing schemes described above, a direct measurement of resistance is involved. A read-write-read-write_restore technique is employed which uses the direct resistance reading to determine the logic state of the MRAM cell. This technique determines the logic state of a cell by reading the resistance of a cross matrix memory cell by either current or voltage integration. A known value is subsequently written to the cell, for example, a logic 1. The cell is read a second time to determine if the resistance state of the has changed with regard to the previous read. If there is no change between the two reads cycles, the resistance state of the cell is equivalent to the known value, and the cell is left unaltered. If there is a change in the resistance of the cell between read cycles, the cell value is not equal to the known value, and the original resistance value is written back to the cell in order to restore the cell to its original state.

However, this technique may not result in an accurate determination of the logic state of the MRAM cell because of the close resistance value between the logic 0 and logic 1 resistance states and cell to cell processing variations. Consequently, this technique requires additional operations to determine the logic state of an MRAM cell. Accordingly, there is a need and desire for another method of sensing the logic state of a programmable resistance memory cell, for example, an MRAM cell.

BRIEF SUMMARY OF THE INVENTION

The present invention provides a method and apparatus for sensing the logic state of data stored in a programmable resistance memory cell. A voltage potential is applied across the cell in a manner which allows a voltage coefficient (VC) of the cell to be determined by measuring the change in resistance value of the cell due to a change in the amount of applied voltage. The cell's voltage coefficient is used to determine the cell's logic state.

The foregoing and other features and advantages of the invention will become more apparent from the detailed description of the exemplary embodiments of the invention given below in connection with the accompanying drawings.

DETAILED DESCRIPTION OF THE INVENTION

The present invention is applicable to any memory cell which relies on a programmed resistance state to store a logic state. Since an MRAM cell is one such programmable resistance memory cell, for convenience, the invention will be described herein with reference to sensing the resistance and thus logic state of an MRAM cell. However, this is only one exemplary use of the invention.

Figure 1:
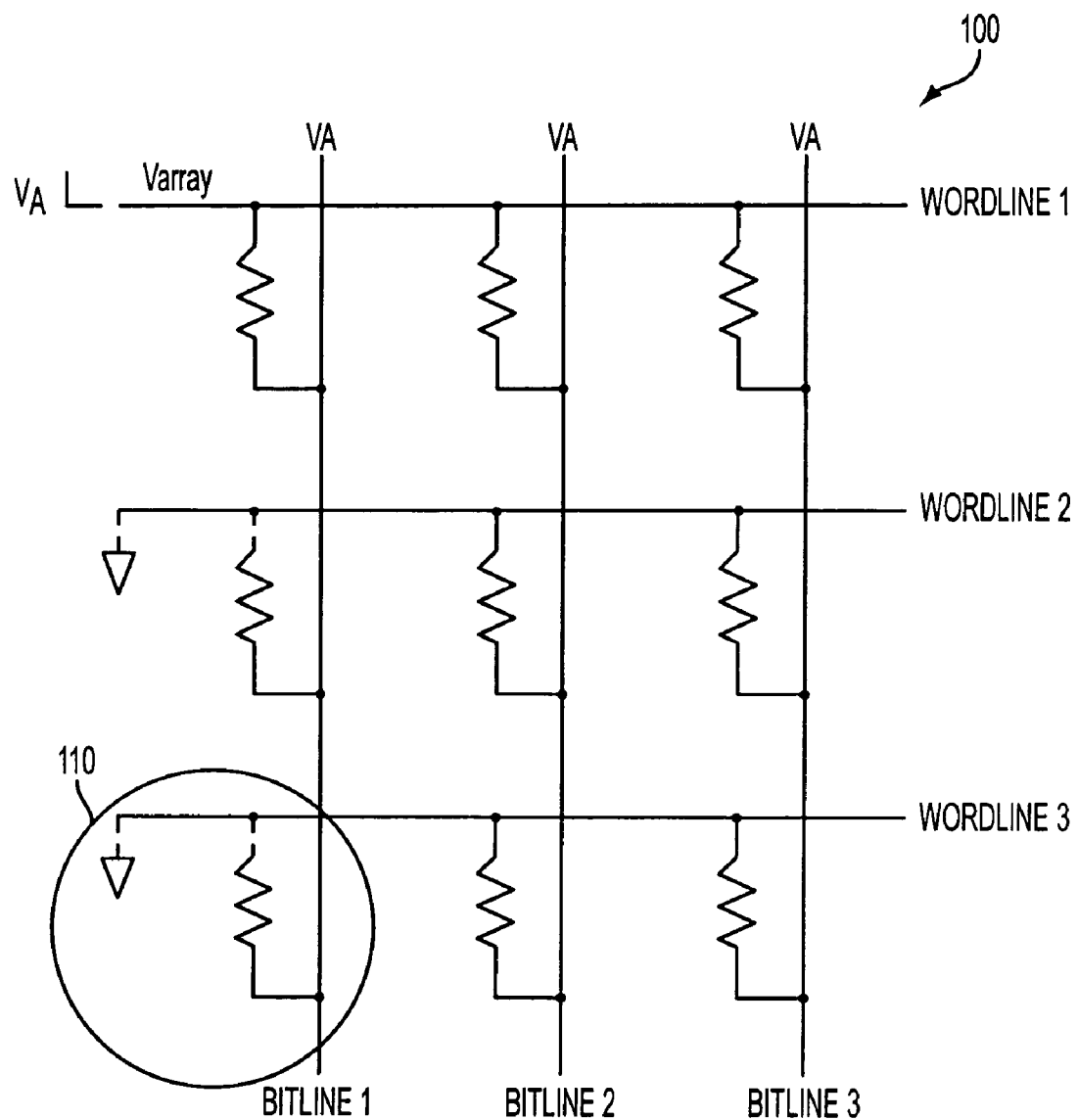
FIG. 1 illustrates an exemplary aspect of an MRAM cross-matrix array utilizing current integration sensing.

A portion of an MRAM array 100 in which the present invention may be used is shown in FIG. 1. Word lines, WORDLINE 1, 2, 3 extend along rows of the array 100, and bit lines, BITLINE 1, 2, 3 extend along columns of the array 100. Each memory cell 110 is located at a cross point of a word line and a bit line. The logic state of an MRAM memory cell e.g. element 110 is represented by the resistance of that cell.

Figure 3:
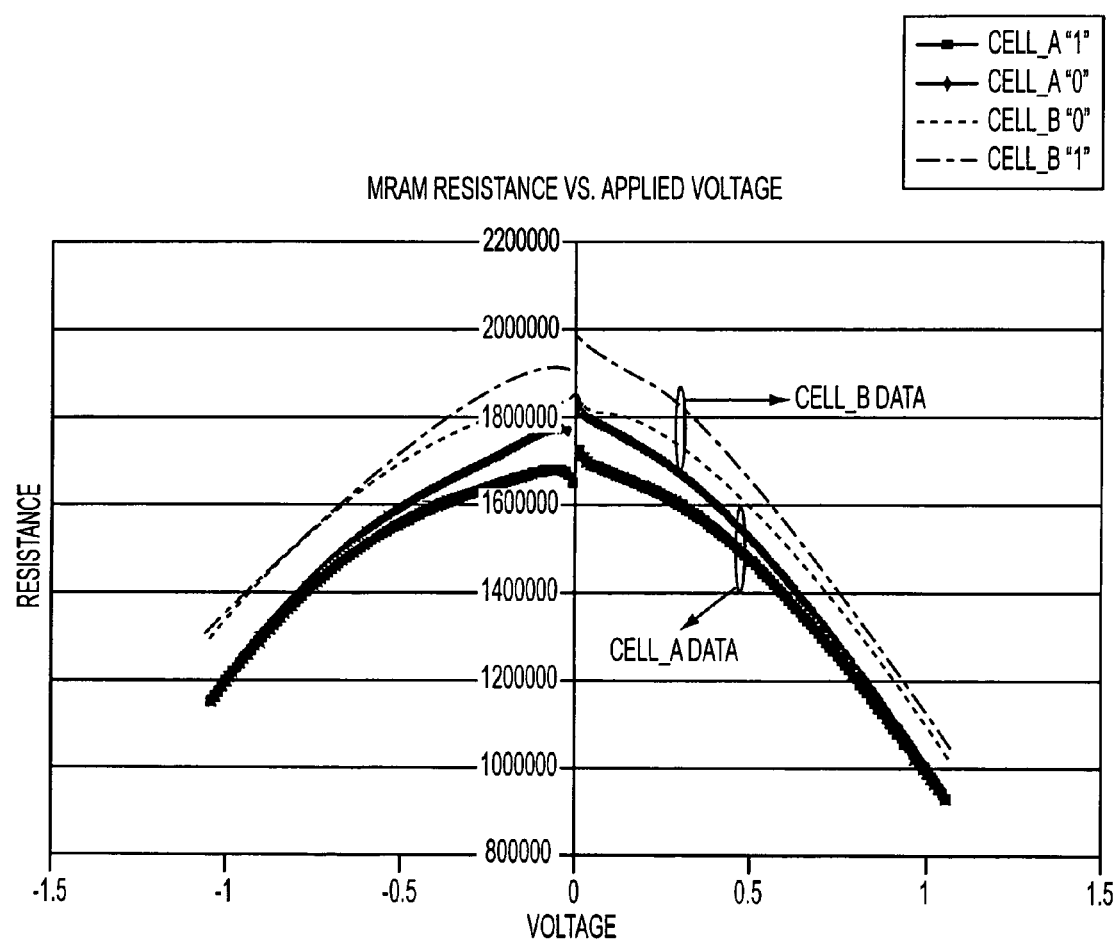
FIG. 3 shows the resistance of an MRAM cell versus applied voltage.

According to one embodiment of the invention, a novel method of sensing the logic state of the MRAM memory cell e.g., 110 uses the cell's voltage coefficient instead of the conventional direct resistance reading. The voltage coefficient is the change in resistance of the cell due to a change in applied voltage. As illustrated in FIG. 3, an MRAM memory cell 110 has a negative voltage coefficient, since the resistance of the memory cell decreases with increased applied voltage across its terminals.

If we look at two cells, A and B in FIG. 3, which may have different absolute resistance values because of processing variations within the same wafer, both have a decreasing resistance as the applied voltage there across increases from 0 to 1 volt. For example, regarding cell B data for a logic 1 high resistance state in FIG. 3, when there is a minimal applied voltage, for example, 0.1V the resistance of the cell is approximately 2 MEGΩ. When an applied voltage of 1V is applied across memory cell 110, the cell's resistance decreases to approximately 1 MEGΩ. Looking at the logic 0 low resistance state of cell B, when there is a minimal applied voltage, for example, 0.1V the cell resistance is approximately 1.8 MEGΩ, and when 1V is applied, it is approximately 1 MEGΩ. As can be seen, the voltage coefficient curve associated with a logic 1 will be higher and have a steeper fall in resistance as compared with applied voltage than the voltage coefficient curve associated with a logic 0. This same phenomena is observed for cell B even though the logic 1 and logic 0 absolute resistance states of cell A are lower than those at cell B due to processing variations. Accordingly, whether a cell is in a high or low resistance state can be determined by measuring the voltage coefficient, that is, which of the logic 1 or logic 0 curves exist for a cell during a read operation.

Figure 5:
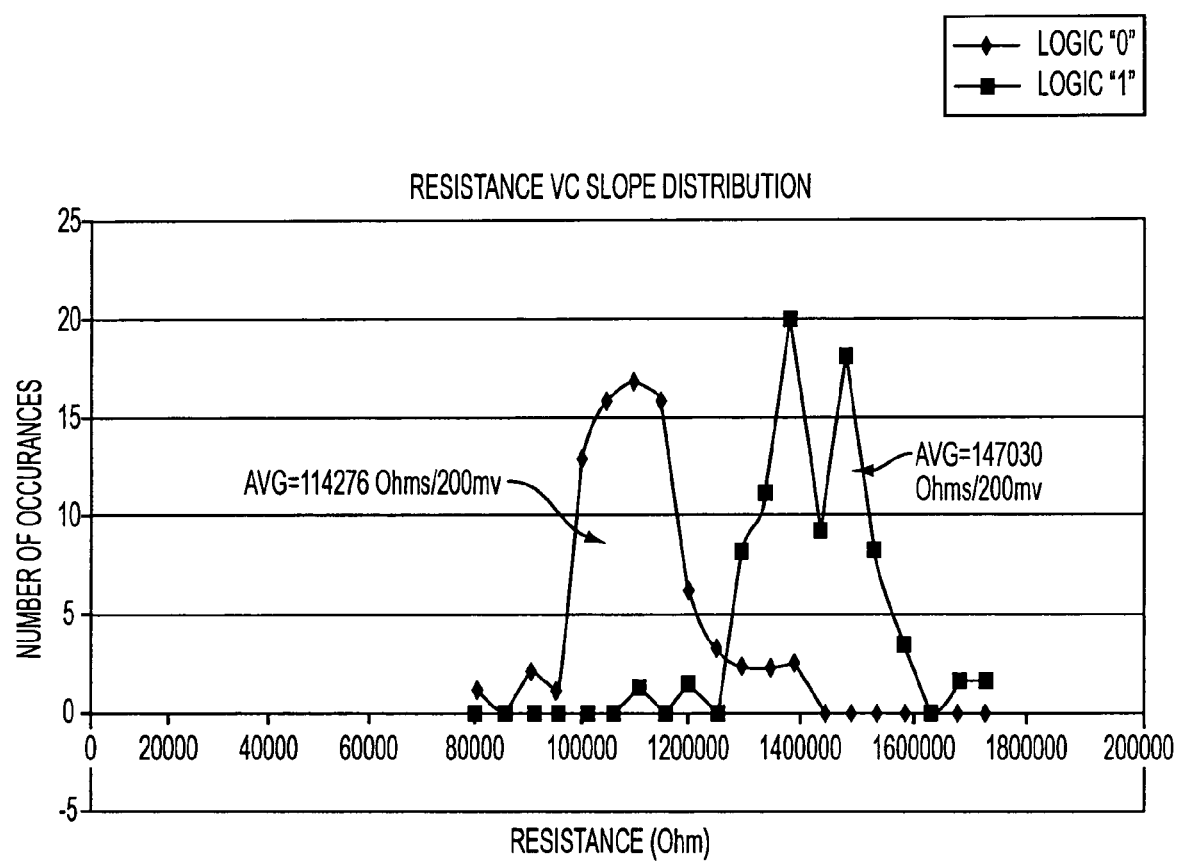
FIG. 5 shows a distribution of voltage coefficients in an MRAM cell between the logic 0 and 1 states.

The use of the MRAM cell's 110 voltage coefficient produces a more effective means of determining the logic state of the cell since the overlap between the logic 0 and 1 states is not as close as the overlap obtained using a direct resistance reading. FIG. 5 shows a voltage coefficient distribution of the logic states for the MRAM cell in accordance with an embodiment of the invention. In FIG. 5, the average voltage coefficient for the logic 1 state of the MRAM memory cell 110 is 147 kΩ/200 mv. The average voltage coefficient for the logic state 0 of the MRAM memory cell 110 is 114 kΩ/200 mv. The window for a sensing circuit to determine the logic state of the cell 110 using the cell's voltage coefficient is on average approximately 33 kΩ/200 mv. Multiple order voltage coefficient curves may also be used to determine the logic state of the cell, i.e., utilizing more than two reference voltages to determine the voltage coefficient.

Figure 4:
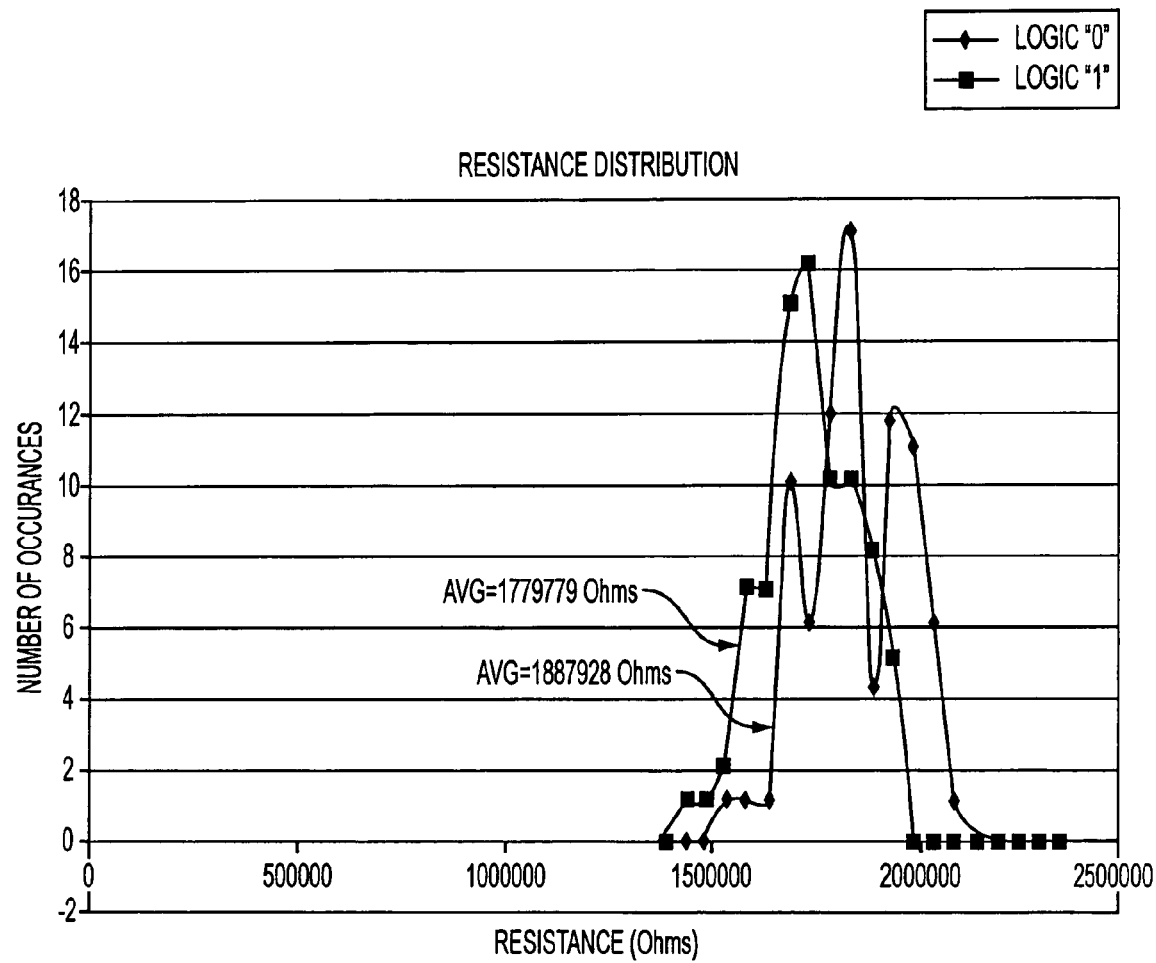
FIG. 4 shows a distribution of resistance between the logic 0 and 1 states in an MRAM cell when utilizing a direct resistance measurement.

In conventional logic sensing techniques, as illustrated in FIG. 4, the average resistance utilizing a direct resistance reading of the MRAM memory cell 110 for a logic 1 state, described above, is approximately 1.78 MEGΩ. The average resistance for the logic state 0 of the MRAM memory cell utilizing a direct resistance reading is 1.89 MEGΩ. The window for a sensing circuit to determine the logic state of the cell 110 using a direct resistance reading is on average approximately 110 kΩ. Since the resistance value distribution for the logic states of the memory cell 110 overlap, an iterative read-write-read-write_restore method is employed to determine the logic state of the memory cell 110, which is not required when using the memory cell's 110 voltage coefficient to determine the memory cell's 110 logic state.

In comparison with the direct resistance reading, known in the art, illustrated in FIG. 4, the use of the cell's voltage coefficient to determine its logic state yields faster and better sensing because there is a larger non-overlapping margin between the logic states than that of the direct resistance readings. As a result, there is no need for a time consuming read-write-read-write_restore scheme since the logic state of the memory cell can be determined without writing to the memory cell.

Figure 2:
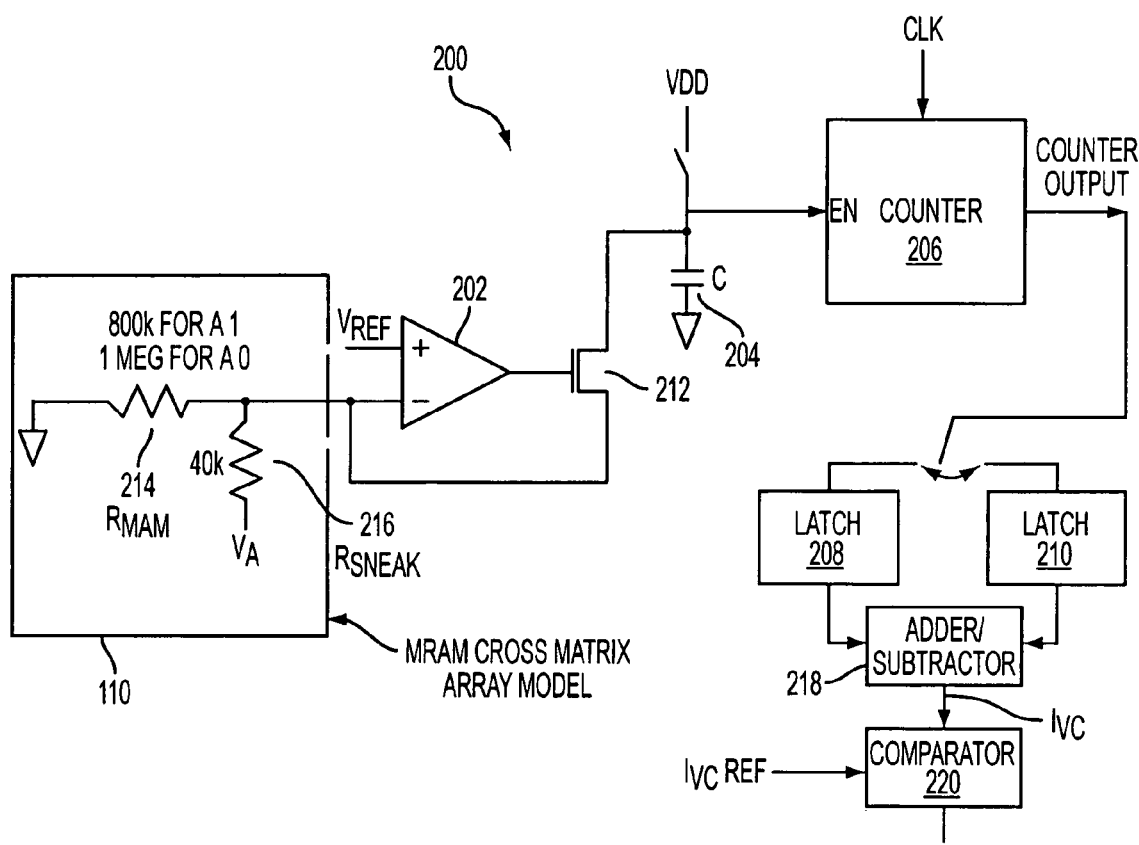
FIG. 2 shows a circuit for sensing resistance using current integration in an MRAM cross-matrix array.

FIG. 2 illustrates a first method and apparatus for determining the voltage coefficient of an MRAM cell 110 using an integration circuit 200. A first reference voltage Vref of, for example, 0.2 volts is applied to the differential amplifier 202 of integration circuit 200, as well as to all unselected columns and rows (FIG. 1) as voltage VA. The output of amplifier 202 is supplied to the gate of transistor 212, which gates a discharge path from a capacitor 204 precharged to VDD to ground through the selected MRAM cell 214. Resistance 216 represents a sneak resistance through other non-selected cells of the array 100. The amplifier 202 turns on transistor 212 to generate a discharge current having a discharge time for capacitor 204 which is measured by the counter 206, which counts clock cycles during the discharge period. The discharge period exits until the voltage on the negative input of amplifier 202 equals or exceeds the Vref input voltage. The discharge time measured as counts in the counter 206 is stored in the first latch 208, and the counter 206 is reset to zero and capacitor 204 is again precharged to VDD. A second different reference voltage Vref is now applied, e.g. 0.3 volts, to amplifier 202 and as voltage VA to the row and columns of the array 100, and the discharge time of the precharged capacitor 204 is once again measured by the counter 206 and stored in the second latch 210.

The count value stored in the first latch 208 is subtracted in adder/subtractor 218 from the value stored in the second latch 210 to represent the voltage coefficient of the memory cell 110, Ivc, which is then compared with an average reference count value Ivcref in comparator 220. The average reference value Ivcref is determined as follows:

$$Ivcref = [[(\text{count value 2} - \text{count value 1}) \text{ of a logic "1" cell}] + [(\text{count value 2} - \text{count value 1}) \text{ of a logic 0 cell}]] / 2$$

If Ivc is greater than Ivcref then the MRAM cell 110 is in a high resistance state, which in this example equates to a logic "1". If Ivc is less than Ivcref then the MRAM cell 110 is in a low resistance state, which in this example equates to a logic "0".

Figure 6:
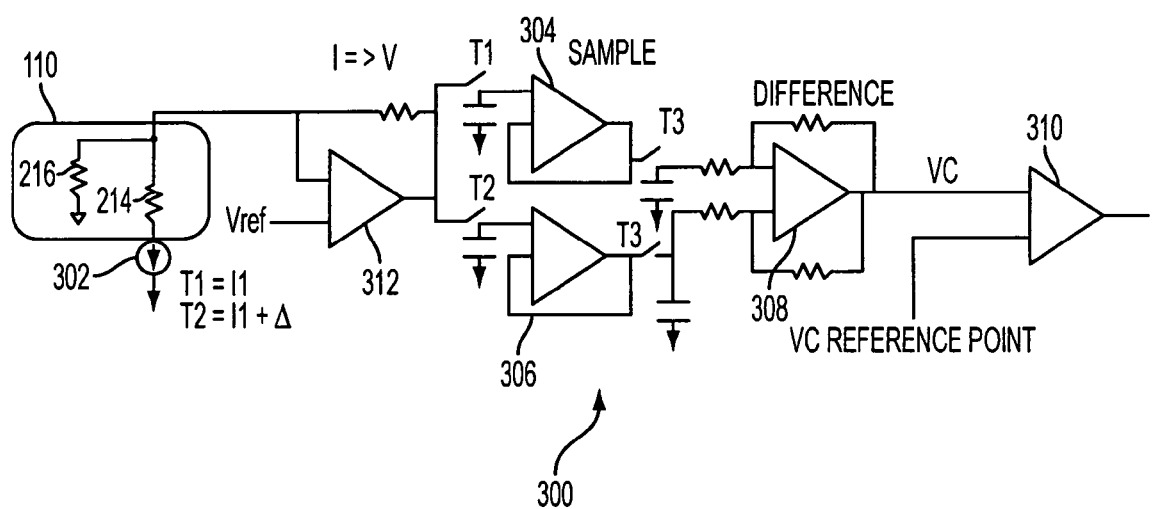
FIG. 6 shows a circuit for sensing resistance using the voltage coefficient in an MRAM cell.

FIG. 6 illustrates another method and apparatus for determining a cell's voltage coefficient. The circuit 300 utilizes a controlled current source 302, an operational amplifier 312, two sample and hold circuits 304, 306, a differential amplifier 308 and a comparator 310.

The controlled current source 302 is used to generate a voltage across the MRAM memory cell 110. A first current I1 is generated by current source 302 and the resulting voltage across cell 110 is then sampled by transistor T1 into the first sample and hold circuit 304 for storage. Once the first voltage is stored, a second current I1+Δ, which is greater than the first current I1, is generated by the controlled current source 302. The second current is used to generate a second voltage across the cell 110, which is sampled by transistor T2 and stored in the second sample and hold circuit 306. The second voltage is greater than the first voltage. Both the first and second voltages are simultaneously input into the differential amplifier 308 by transistors T3 and T4, and the differential amplifier 308 subtracts the first voltage from the second voltage. The output of the differential amplifier 308 represents the voltage coefficient of the MRAM memory cell 110. The output of the differential amplifier 308 is compared with a reference voltage coefficient in the comparator 310. If the voltage coefficient is greater than a reference voltage coefficient, the MRAM cell 110 is in a high resistance state, which in this example equates to logic "1". If the voltage coefficient is less than the reference voltage coefficient, the MRAM cell 110 is in a low resistance state, which in this example equates to logic "0". The voltages generated by current source 302 that provide the largest contrast in voltage coefficients between the logic states are between about 150 mv and about 300 mv which could vary depending on the MRAM structure and process technology.

Figure 7:
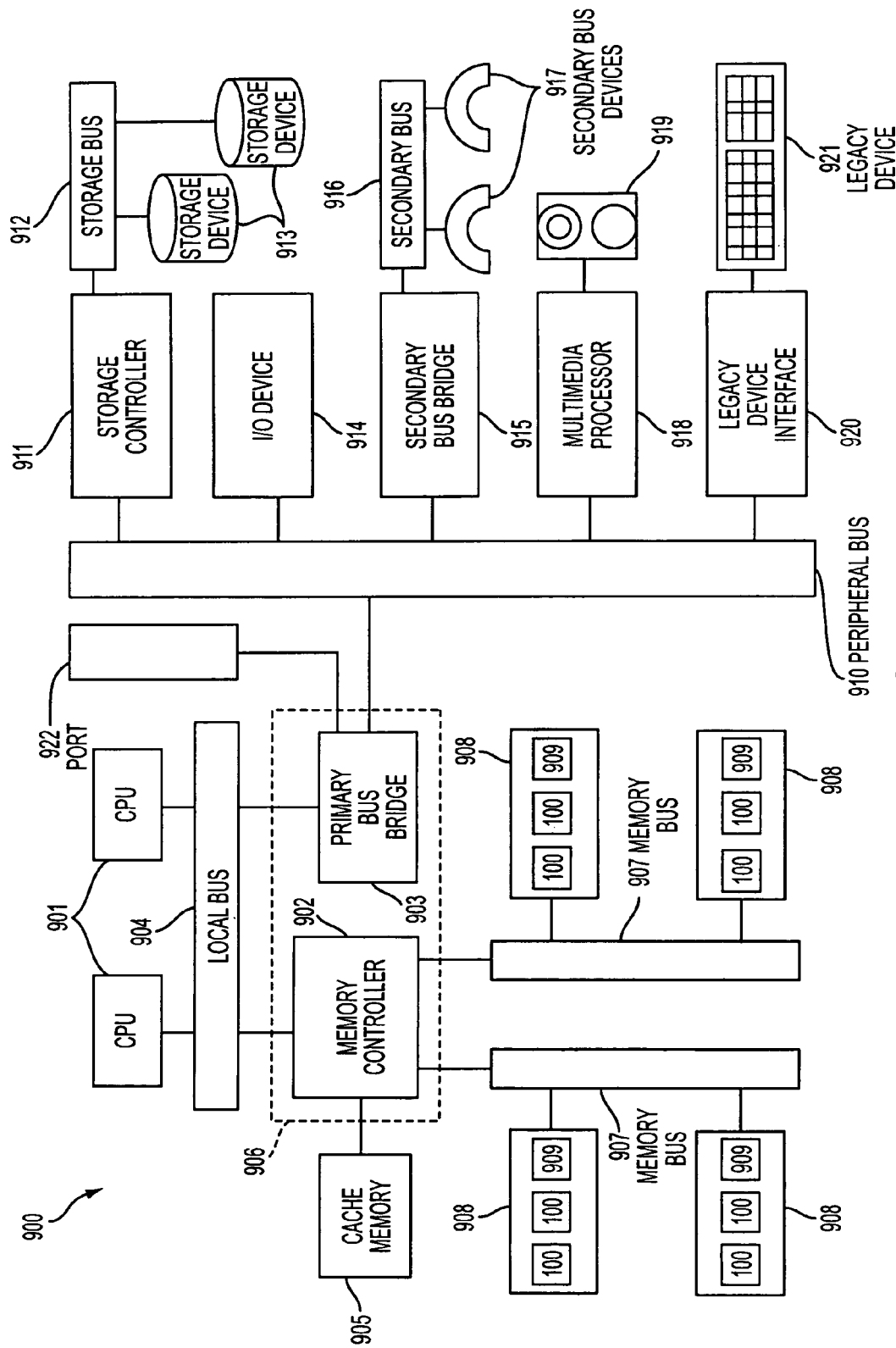
FIG. 7 shows an MRAM device containing the invention utilized in a computer system.

FIG. 7 illustrates an exemplary processing system 900 that may utilize a memory device 100 containing the cell resistance measuring method and apparatus of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 100. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers, which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be a universal serial port (USB) controller used to couple USB devices 917 via to the processing system 900. The multimedia processor 918 may be a sound card, a video capture card, or any other type of media interface, which may also be coupled to additional devices such as speakers 919. The legacy device interface 920 is used to couple legacy devices, for example, older styled keyboards and mice, to the processing system 900.

The processing system 900 illustrated in FIG. 7 is only an exemplary processing system with which the invention may be used. While FIG. 7 illustrates a processing architecture especially suitable for a general purpose computer, such as a personal computer or a workstation, it should be recognized that well known modifications can be made to configure the processing system 900 to become more suitable for use in a variety of applications. For example, many electronic devices, which require processing, may be implemented using a simpler architecture, which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While preferred embodiments of the invention have been described and illustrated above, it should be understood that these are exemplary of the invention and are not to be considered as limiting. For example, although the invention has been described as having particular utility in measuring the resistance of MRAM memory cells, as noted it also has utility in determining the resistance of any memory cell employing different resistance values to store logic states. Moreover, additions, deletions, substitutions, and other modifications can be made without departing from the spirit or scope of the present invention. Accordingly, the invention is not to be considered as limited by the foregoing description but is only limited by the scope of the appended claims.

The invention claimed is:

1. A method of sensing a resistance state of a resistance memory cell comprising:
    discharging a precharged capacitor through said cell under a first operative condition to produce a first discharge period;
    precharging the capacitor;
    discharging the capacitor through said cell under a second operative condition to produce a second discharge period; and
    using the first and second discharge periods to determine a resistance state of said cell.

2. The method of claim 1, wherein determining the resistance state comprises subtracting a first discharge time from a second discharge time and comparing the subtracted value to a predetermined value.

3. The method of claim 2, wherein a difference between said first and second discharge times represent a voltage coefficient of the cell.

4. The method of claim 3, wherein said voltage coefficient value is compared to a reference value to determine a logic state of said memory cell.

5. The method of claim 1 further comprising resetting the capacitor to a precharge state prior to said measuring of said second discharge period.

6. The method of claim 1, wherein said using operation comprises:
    counting clock cycles during said first and second discharge periods;
    calculating a difference between the counted clock signals; and
    comparing the calculated difference to a predetermined value to determine a resistance state.

7. The method of claim 1, wherein said memory cell is an MRAM memory cell.

8. A sensing circuit for a magnetic memory cell comprising:
    a first circuit for discharging a precharged capacitor through said cell under a first discharge condition, precharging the capacitor and discharging the capacitor through said cell under a second discharge condition;
    a second circuit for measuring discharge times under said first and second discharge conditions; and
    a third circuit for determining a voltage coefficient from said measured discharge times and determining a resistance state of the memory cell based on the voltage coefficient.

9. The circuit of claim 8, wherein said first circuit comprises:
    an amplifier having a first reference voltage input for receiving a selected reference voltage and a second input coupled to a circuit containing said cell for receiving said discharge voltage; and
    a transistor coupled to an output of said amplifier for coupling said capacitor to said second input.

10. The circuit of claim 9, wherein said second circuit comprises:
    a counter for counting a clock input during each of said discharge times; and
    a first and second latch for respectively storing counts produced by said counter during said discharge times.

11. The circuit of claim 10, wherein said third circuit comprises:
    an adder/subtractor for calculating a difference between the output of said latches; and
    a comparator for comparing the calculated difference with a predetermined value.

12. The circuit of claim 8, wherein said capacitor is precharged prior to each of said first and second discharge times.

13. The circuit of claim 12 wherein said counter is reset prior to said first and second discharge times.

14. The circuit of claim 8, wherein said third circuit further determines the resistance state as being one value if said voltage coefficient is greater than a reference voltage coefficient and another value if said voltage coefficient is less than said reference voltage coefficient.

15. The circuit of claim 8, wherein said memory cell is an MRAM memory cell.

16. A resistance memory device, comprising:
    an array of resistive elements, each resistive element having a resistance value; and
    a sensing circuit for sensing a resistance state of a selected resistive element, said sensing circuit comprising:
        a first circuit for discharging a precharged capacitor through said cell under a first discharge condition, precharging the capacitor and discharging the capacitor through said cell under a second discharge condition;
        a second circuit for measuring discharge times under said first and second discharge conditions; and
        a third circuit for determining a voltage coefficient from said measured discharge times and determining a resistance state of the memory cell based on the voltage coefficient.

17. The resistance memory device of claim 16, wherein said capacitor is precharged prior to each of said first and second discharge times.

18. The resistance memory device of claim 16 wherein said counter is reset prior to said first and second discharge times.

19. The resistance memory device of claim 16, wherein said third circuit further determines the resistance state as being one value if said voltage coefficient is greater than a reference voltage coefficient and another value if said voltage coefficient is less than said reference voltage coefficient.

20. The resistance memory device of claim 16, wherein said memory device is an MRAM device.

21. A processor circuit, comprising:
    a processor; and
    a resistance memory circuit coupled to said processor, said resistance memory circuit comprising at least one resistive memory element having a programmable resistance value, and a sensing circuit for sensing the resistance state of a selected resistance memory element, said sensing circuit comprising:
        a first circuit for discharging a precharged capacitor through said cell under a first discharge condition, precharging the capacitor and discharging the capacitor through said cell under a second discharge condition;
        a second circuit for measuring discharge times under said first and second discharge conditions; and
        a third circuit for determining a voltage coefficient from said measured discharge times and determining a resistance state of the memory cell based on the voltage coefficient.

22. The processor circuit of claim 21, wherein said capacitor is precharged prior to each of said first and second discharge times.

23. The processor circuit of claim 21 wherein said counter is reset prior to said first and second discharge times.

24. The processor circuit of claim 21, wherein said third circuit further determines the resistance state as being one value if said voltage coefficient is greater than a reference voltage coefficient and another value if said voltage coefficient is less than said reference voltage coefficient.

* * * * *

UNITED STATES PATENT AND TRADEMARK OFFICE
CERTIFICATE OF CORRECTION

PATENT NO. : 7,061,789 B2
APPLICATION NO. : 10/610800
DATED : June 13, 2006
INVENTOR(S) : Hagop A. Nazarian It is certified that error appears in the above-identified patent and that said Letters Patent is hereby corrected as shown below:

In the Specification, the following errors are corrected:

Column 1, line 31, "compare" should read --compared--;

Column 2, line 27, "the has" should read --the cell has--;

Column 5, lines 45-46, "coupled the" should read --coupled to the --; and

Column 6, line 49, "system" should read --systems--.

In Claim 3, the following error is corrected:

Column 7, line 17, "represent" should read --represents--.

Signed and Sealed this

Thirteenth Day of February, 2007

JON W. DUDAS
*Director of the United States Patent and Trademark Office*